US008890256B2

(12) United States Patent
Hakey et al.

(10) Patent No.: US 8,890,256 B2
(45) Date of Patent: Nov. 18, 2014

(54) STRUCTURE FOR HEAVY ION TOLERANT DEVICE, METHOD OF MANUFACTURING THE SAME AND STRUCTURE THEREOF

(75) Inventors: Mark C. Hakey, Fairfax, VT (US); Tak H. Ning, Yorktown Heights, NY (US); Philip J. Oldiges, Lagrangeville, NY (US); Henry H. K. Tang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1274 days.

(21) Appl. No.: 12/408,205

(22) Filed: Mar. 20, 2009

(65) Prior Publication Data

US 2010/0237389 A1    Sep. 23, 2010

(51) Int. Cl.
*H01L 29/76* (2006.01)
*H01L 29/94* (2006.01)
*H01L 21/8238* (2006.01)

(52) U.S. Cl.
USPC ............ 257/369; 257/206; 257/371; 438/199

(58) Field of Classification Search
USPC ......... 257/204, 206, 341–343, 369, 371, 401, 257/E21.632, E27.062; 438/199
See application file for complete search history.

(56) References Cited

U.S. PATENT DOCUMENTS

| 4,714,840 | A | 12/1987 | Proebsting |
| 5,151,759 | A | 9/1992 | Vinal |
| 5,528,056 | A | 6/1996 | Shimada et al. |
| 5,703,381 | A | 12/1997 | Iwasa et al. |
| 5,987,086 | A * | 11/1999 | Raman et al. .................. 716/120 |
| 6,184,559 | B1 | 2/2001 | Hayakawa et al. |
| 6,268,630 | B1 | 7/2001 | Schwank et al. |
| 6,794,908 | B2 | 9/2004 | Erstad |
| 6,804,502 | B2 | 10/2004 | Burgener et al. |
| 7,067,366 | B2 * | 6/2006 | Gehres .......................... 438/199 |
| 7,298,010 | B1 * | 11/2007 | Ma ................................ 257/359 |
| 7,304,354 | B2 | 12/2007 | Morris |
| 7,332,780 | B2 | 2/2008 | Matsuda et al. |
| 7,888,959 | B2 | 2/2011 | Cannon et al. |
| 8,541,879 | B2 * | 9/2013 | Smayling ...................... 257/774 |
| 2002/0182884 | A1 | 12/2002 | Bernkopf et al. |
| 2003/0214773 | A1 | 11/2003 | Kitagawa |
| 2004/0007743 | A1 | 1/2004 | Matsuda et al. |

(Continued)

FOREIGN PATENT DOCUMENTS

JP    10093023    4/1998

OTHER PUBLICATIONS

U.S. Appl. No. 11/857,596.

(Continued)

*Primary Examiner* — Hung Vu
(74) *Attorney, Agent, or Firm* — Anthony Canale; Roberts Mlotkowski Safran & Cole, P.C.

(57) ABSTRACT

The invention relates to a design structure, and more particularly, to a design structure for a heavy ion tolerant device, method of manufacturing the same and a structure thereof. The structure includes a first device having a diffusion comprising a drain region and source region and a second device having a diffusion comprising a drain region and source region. The first and second device are aligned in an end-to-end layout along a width of the diffusion of the first device and the second device. A first isolation region separating the diffusion of the first device and the second device.

24 Claims, 9 Drawing Sheets

(56) References Cited

U.S. PATENT DOCUMENTS

| 2004/0140483 | A1 | 7/2004 | Yonemaru |
| 2005/0179093 | A1 | 8/2005 | Morris |
| 2006/0001045 | A1 | 1/2006 | Sidhu et al. |
| 2009/0072313 | A1 | 3/2009 | Cai et al. |

OTHER PUBLICATIONS

Makihara et al., "SEE in a 0.15 μm Fully Depleted CMOS/SOI Commercial Process", IEEE Transactions on Nuclear Science, vol. 51, No. 6, Dec. 2004, pp. 3621-3625.

Makihara et al., "Hardness-by-Design Approach for 0.15 μm Fully Depleted CMOS/SOI Digital Logic Devices with Enhanced SUE/SET Immunity", IEEE Transactions on Nuclear Science, vol. 52, No. 6, Dec. 2006, pp. 2524-2530.

Makihara et al., "Optimization for SEU/SET Immunity on 0.15 μm Fully Depleted CMOS/SOI Digital Logic Devices", IEEE Transactions on Nuclear Science, vol. 53, No. 6, Dec. 2006, pp. 3422-3427.

Office Action dated Feb. 5, 2009 in U.S. Appl. No. 11/857,569, 17 pages.

Office Action dated Jul. 28, 2009 in U.S. Appl. No. 11/857,569, 21 pages.

Office Action dated Mar. 18, 2010 in U.S. Appl. No. 11/857,569, 27 pages.

Office Action dated Feb. 25, 2013 in U.S. Appl. No. 11/857,569, 7 pages.

Office Action dated Oct. 24, 2013 in U.S. Appl. No. 11/857,569, 12 pages.

Tang, "Nuclear Processes and Soft Fails in Microelectronics", Nuclear Physics A, vol. 752, Apr. 2005, Abstract, 2 pages.

Gordon et al., "Measurement of the Flux and Energy Spectrum of Cosmic-Ray Induced Neutrons on the Ground", IEEE Transactions on Nuclear Science, vol. 51, No. 6, Dec. 2004, pp. 3427-3434.

Makihara et al., "Optimization for SEU/SET Immunity on 0.15 μm Fully Depleted CMOS/SOI Digital Logic Devices", The 7th Annual Workshop on Radiation Effects on Semiconductor Devices for Space Application, Oct. 16-18, 2006; 16 pages.

Final Office Action dated May 16, 2014 for U.S. Appl. No. 11/857,569; 24 pages.

\* cited by examiner

STRUCTURE FOR HEAVY ION TOLERANT DEVICE, METHOD OF MANUFACTURING THE SAME AND STRUCTURE THEREOF

FIELD OF THE INVENTION

The invention relates to a design structure, and more particularly, to a design structure for a heavy ion tolerant device, method of manufacturing the same and a structure thereof.

BACKGROUND

Commercial microelectronics have higher performance, function, and density compared with microelectronics designed for space and military applications. However, designs for such commercial microelectronics result in failure caused by Single Event Upset (SEU) in space applications. For example, ionizing radiation in space (and ground) based applications directly upset storage circuits, such as SRAMs, register files and flip-flops. Moreover, radiation events in combinational logic create voltage glitches that can be latched. Also, SEUs may cause the circuit to perform incorrect or illegal operations; whereas, an accumulation of radiation over a long period of time may additionally lead to complete device failure.

More specifically, in space applications, the major radiation sources are high-energy protons and high-energy heavy ions (from helium up to about any heavy stable isotope). The high-energy cosmic protons and ions are known to produce secondary fragments which cause SEUs and single event latchups (SELs), as well as total failure resulting from total dose (long accumulation of radiation) in semiconductor ICs. Fluxes of cosmic protons and heavy ions can be estimated by models like Cosmic Ray Effects on Microelectronics (CREME) software packages.

For applications on the ground, a major source of radiation is from neutrons. These terrestrial neutrons interact with the devices and the packaging materials to produce secondary (spallation) ions that cause upsets (mainly single event upsets SEUs). The spectra of the secondary ions depend on the device back end of the line (BEOL) materials. The terrestrial neutron flux has been measured and modeled very accurately. In modern nuclear physics and high-energy physics experiments, man-made radiation environments are often generated near the microelectronics that control the detector systems, because the primary beam produces secondary particles (e.g., protons, heavy ions, pions and other particles) which can cause SEUs and SELs. The designs in this invention will also cover these situations.

Figure 9:
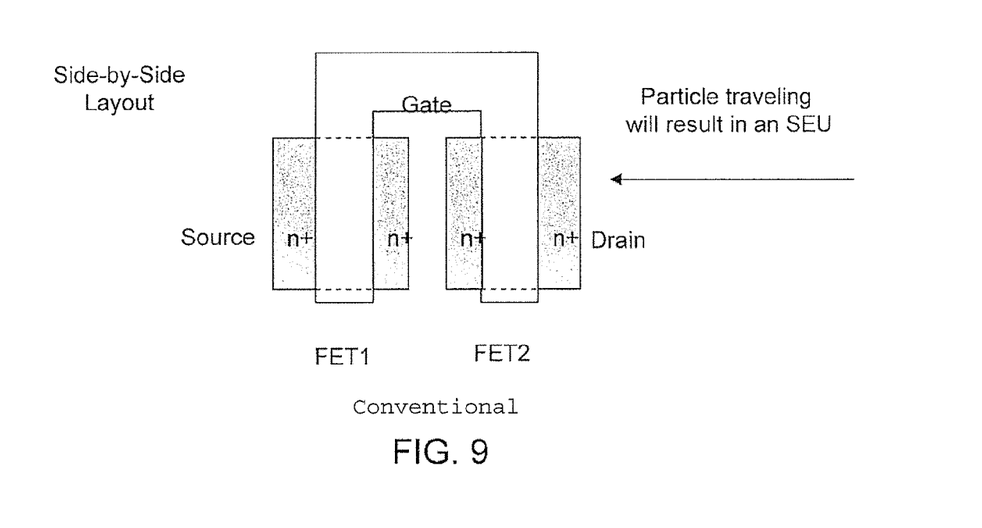
FIGS. 9 and 10 show conventional structures discussed in the background.

These upsets, e.g., SEUs, SELs and total failure, occur in many types of commercial device configurations. In one known device configuration, an SOI series device consists of two FETs laid out side by side, where each FET has its own source and drain diffusion regions and each FET is completely surrounded by oxide regions (STI) (FIG. 9). The drain of one FET (FET1) and the source of the other FET (FET2) are connected together electrically by a conducting material. In such device configuration, a charge build-up can occur at an interface between an oxide (STI) and an SOI due to prolonged radiation exposure (total dose) or a high energy single event. This build-up will eventually change the charge flow at the SOI interface, which can lead to a shift in Vt of the device. If the Vt is allowed to move further enough from the design point, the circuitry can fail to operate. Also, in this device configuration, a high energy particle hitting FET1, in the horizontal direction, can travel through the STI and into the adjacent FET2. If this series-connected device is biased to be in the off state when this happens, the horizontally traveling high energy particle can turn on both FETs simultaneously, and hence change the series-connected device from an off state to an on state, thus causing an error.

Alternatively, in another commercial device configuration (see, FIG. 10), a floating n+ region is provided between two gates for the purposes of isolating each of the gates. In this configuration, two adjacent FETs are laid out side by side, sharing one common diffusion with a floating n+ region. The common diffusion is doped to form a drain of one FET (FET1) and a source of the other FET (FET2). In this configuration, when a high energy particle strikes one of the FETs in a direction more or less perpendicular to the semiconductor surface, the electrons generated in the FET being struck can diffuse readily into the other FET unless the width of the floating n+ region is larger than the hole diffusion length. If this happens when the series-connected device is biased in the off state, the diffusion of holes from the FET being struck into the other FET can cause the other FET to be turned on. The net result is that a series-connected device of this configuration can be turned from an off state into an on state when a high energy particle strikes one of the FETs in a direction more or less perpendicular to the semiconductor surface, unless the floating n+ region has a width larger than the hole diffusion length.

Figure 10:
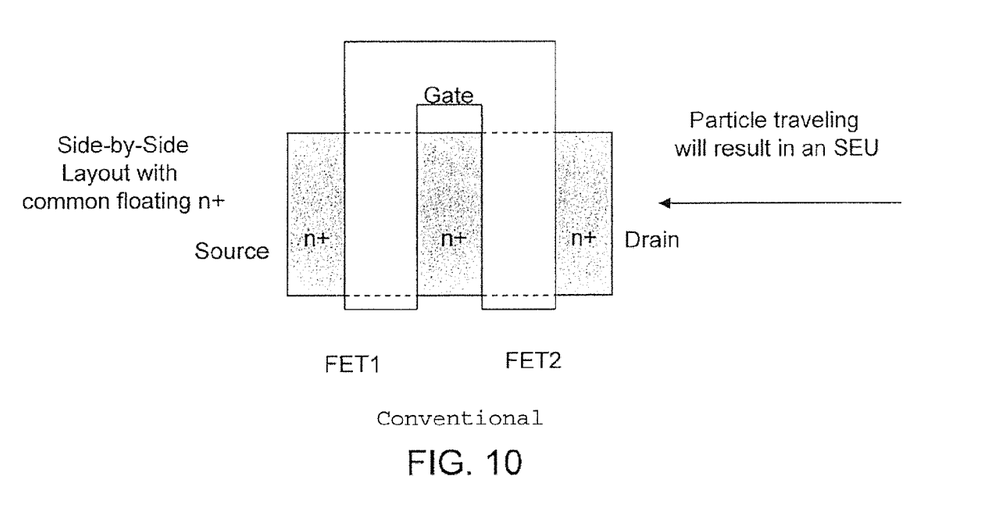

The n+ regions for source and drain have a typical doping concentration of $1E20\ cm^{-3}$. The corresponding hole diffusion length is about 300 nm, which is quite large compared with the minimum lithography dimensions of modern integrated circuit technology. For example, the most advanced CMOS technology in production has a minimum lithographic dimension of only 45 nm. The net is that the series-connected device configuration shown in FIG. 10 is not totally immune to single event upsets when a high energy particle strikes it in a direction more or less perpendicular to the semiconductor surface, unless the width of the floating n+ region is kept at a dimension larger than 300 nm.

Minimizing the occurrence of such upsets with minimal change to design and process would allow the use of close derivatives of commercial components with close to commercial performance, function, and density with a minimal schedule delay. This is crucial for maintaining strategic differentiation for US defense systems against potential adversaries. However current methods to prevent SEUs and total dose include adding spatial and/or temporal redundancy, so that a single radiation event cannot cause an SEU. The series-connected devices shown in FIGS. 9 and 10 provide built-in redundancy at the device level. As explained in the previous paragraphs, device configuration in FIG. 9 is superior to that in FIG. 10 in minimizing SEUs. Nonetheless, the device configuration in FIG. 9 is still sensitive to SEUs when it is struck by a high energy particle traveling more or less horizontally as illustrated in FIG. 9. Consequently, there is a need to improve the series-connected SOI CMOS devices to improve susceptible to radiation events, including when being hit by high energy particles traveling more or less horizontally.

Accordingly, there exists a need in the art to overcome the deficiencies and limitations described hereinabove.

SUMMARY

In a first aspect of the invention, a structure includes a first device having a diffusion comprising a drain region and source region and a second device having a diffusion comprising a drain region and source region. The first and second device are aligned in an end-to-end layout along a width of the diffusion of the first device and the second device. A first isolation region separating the diffusion of the first device and the second device.

In another aspect of the invention, a structure includes a first device having a diffusion area and a second device having a diffusion area and aligned in an end-to-end layout along a width of the diffusion area of the first device and the second device. A first isolation region isolates the first device from the second device and extends in the width direction between the diffusion area of the first device and the second device. A common gate is associated with the first device and the second device, and extends in the width direction of the diffusion area of the first device and the second device.

In yet another aspect of the invention, a method of forming a structure comprises: forming a first device with a diffusion comprising a drain region and source region; forming a second device with a diffusion comprising a drain region and source region and aligned in an end-to-end layout along a width of the diffusion of the first device and the second device; and forming an isolation region separating the diffusion of the first device and the second device.

In a further aspect of the invention, a design structure for a rad hard device is embodied in a machine readable medium for designing, manufacturing, or testing an integrated circuit. The design structure comprises: a first device having a diffusion comprising a drain region and source region; a second device having a diffusion comprising a drain region and source region, the first and second device being aligned in an end-to-end layout along a width of the diffusion of the first device and the second device; and a first isolation region separating the diffusion of the first device and the second device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a design structure, and more particularly, to a design structure for a heavy ion tolerant device, method of manufacturing the same and a structure thereof. More specifically, the invention is directed to physical arrangements or layouts of component FETs in an SOI series device to reduce its sensitivity to radiation effects. In the layouts of the invention, a minimum adjustable isolation region may be provided between the diffusions of each of the FETs. In embodiments, the isolation region may be 1× to 2× that of the gate length of the device, e.g., 45 nm to 90 nm (or more) for CMOS at 45 nm node. In further embodiments, the P and N devices can be inter-digitated (interleaved) so that stacked, i.e. series-connected, NFET's are not physically next to each other. As a result, the embodiments of the invention are superior to known device layouts in terms of reduced sensitivity to radiation effects, e.g., the arrangement of the component FETs significantly reduces the chance of one radiation particle hitting more than one component FET.

First Aspect of the Invention

Figure 1:
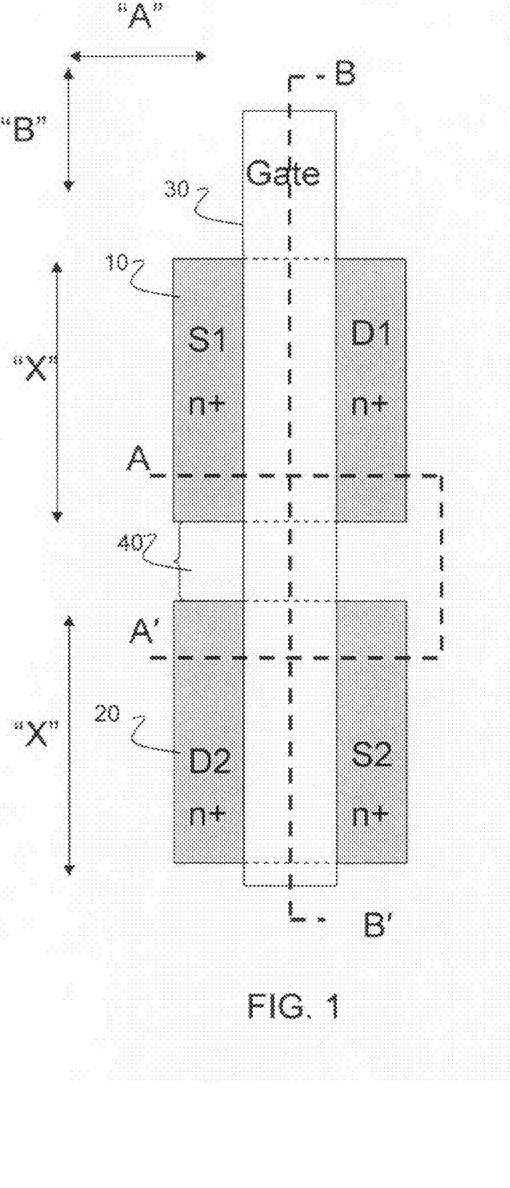
FIG. 1 shows a top view of a first device layout in accordance with a first aspect of the invention.

FIG. 1 shows a top view of a first device layout in accordance with a first aspect of the invention. In particular, FIG. 1 shows two devices (FETs) 10, 20 in an end-to-end layout (e.g., aligned along a gate width) on a same level of the structure. In the embodiment shown, a drain of the FET 10 is connected to a source of the FET 20 by a wire (not shown). The FET 10 and FET 20 also share a common gate 30. In embodiments, the gate 30 can be a metal gate or poly (i.e., polysilicon) gate, all of which are known to those of skill in the art that further explanation is not required herein in order to understand the invention.

In 45 nm technology, the width of the diffusion regions (n+ regions) of the FET 10 and FET 20, as represented by distance "X" in FIG. 1, can range from about 100 nm to 400 nm and more specifically from about 300 nm to about 400 nm. In embodiments, the width "X" of the diffusion regions is contemplated to be more specifically about 350 nm. In embodiments of any aspect of the invention, the diffusion of the devices can range from about 2× to about 10× of a gate length or channel length. In any scenario, the diffusion regions are long and narrow.

An isolation region 40 is provided between the diffusion regions of the FET 10 and FET 20. In embodiments, the isolation region 40 is adjustable and can range, in embodiments, between about 1× to 2× of the channel length (e.g., 45 nm to 90nm in 45 nm technology). Those of skill in the art should realize, though, that other distances of the isolation region 40 are also contemplated by the invention.

In the layout of the first aspect of the invention, a high energy particle hitting either of the devices (FETs) 10, 20 in the direction of arrow "A", will not result in a SEU. This is due to the fact that the devices (FETs) 10, 20 are not aligned, side-by-side (along the gate length) and, as such, any high energy particle passing through the gate length (diffusion region) of one FET will not pass through or hit-the other FET.

There is also a very low probability that a high energy particle hitting the structure of FIG. 1 in the widthwise direction will result in an SEU. In order to result in an SEU, the high energy particle would have to hit the body regions of both devices (FETs) in its path. The body of a device (FET) is bounded horizontally along the gate length direction (arrow "A" in FIG. 1) by the diffusion regions and along the gate width direction (arrow "B" in FIG. 1) by isolation regions, and vertically on the top by the gate insulator (the thin insulator underneath the gate electrode) and at the bottom by the buried oxide (the relatively thick oxide about the wafer substrate of an SOI). The diffusion regions can range from about 2× to about 10× of a gate length or channel length.

For example, a high energy particle travelling in the direction of arrow "B" has a very low probability of causing a SEU. This is due to the fact that the high energy particle hitting the body of one device (FET) would have to travel a large distance, e.g., upwards in some structures of more than 490 nm, and at a very narrow angle of attack before approaching the body region of the other device (FET). That is, the high energy particle would have to pass through the entire or substantially the entire width of the body region of one device (FET) as well as the isolation region 40 at a specific range of angles in order to hit the body region of the other device to cause such an SEU. A further explanation of several possible scenarios is discussed in more detail with reference to FIGS. 5-7.

Figure 1A:
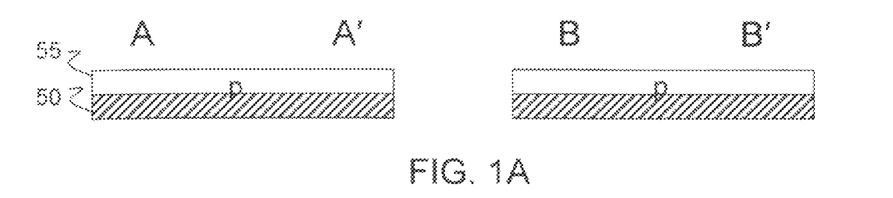
FIGS. 1A-1D show structures and respective processing steps in accordance with the first aspect of the invention.
Figure 1B:
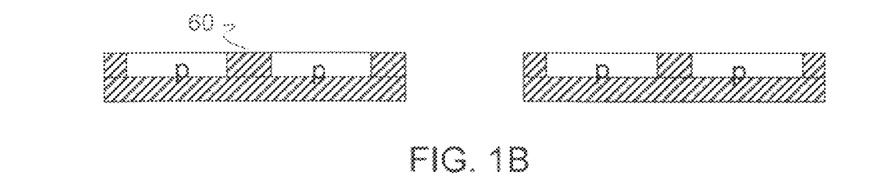

FIGS. 1A-1D show structures and processes for the fabrication of the structure of FIG. 1, along cross section A-A' and B-B'. More specifically, FIG. 1A shows a beginning structure comprising an SOI wafer 50 (SOI substrate not shown) with a Si doped p-type 55 for an NFET. In FIG. 1B, an oxide-filled shallow-trench isolation structure(s) 60 is formed using conventional processing. For example, a trench(es) is formed in the structure of FIG. 1A using a conventional etching process, e.g., reactive ion etching (RIE) and filled with an oxide material. In embodiments, the structure shown in FIG. 1B can be planarized using a conventional chemical mechanical polishing (CMP).

Figure 1C:
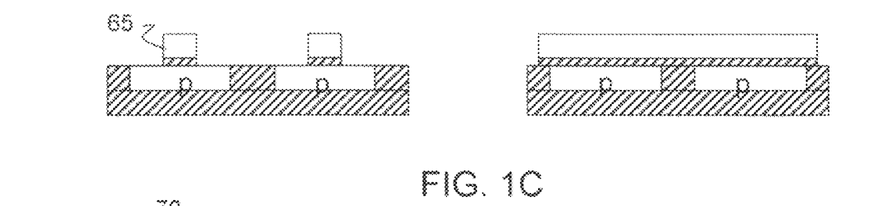

In FIG. 1C, a gate structure 65 is formed using conventional fabrication processes. For example, a poly gate can be formed by depositing an oxide layer and poly layer on the structure of FIG. 1B. The oxide layer and poly layer can then be patterned using conventional lithographic and etching processes to form the gate structure 65. In embodiments, nitride sidewalls and cap layer can be formed on the patterned structure to complete the gate structure 65.

Figure 1D:
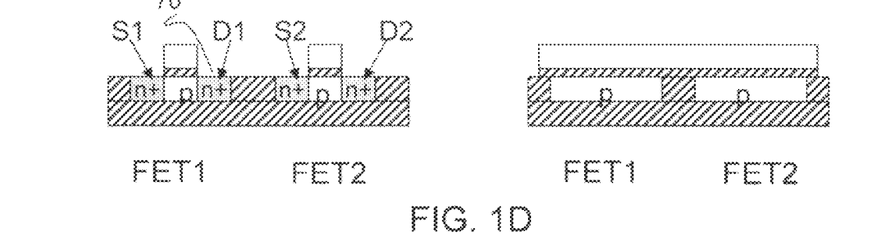

In FIG. 1D, a conventional doping/implantation process is performed to form n+ diffusion regions 70 (source and drain regions). In the embodiment shown in FIG. 1D, diffusion (drain) D1 of FET1 is laid out end-to-end in alignment with the diffusion (source) S2 of the FET2. Also, diffusion (drain) D2 of the FET1 is laid out end to end in alignment with the diffusion (source) S1 of the FET2.

Second Aspect of the Invention

Figure 2:
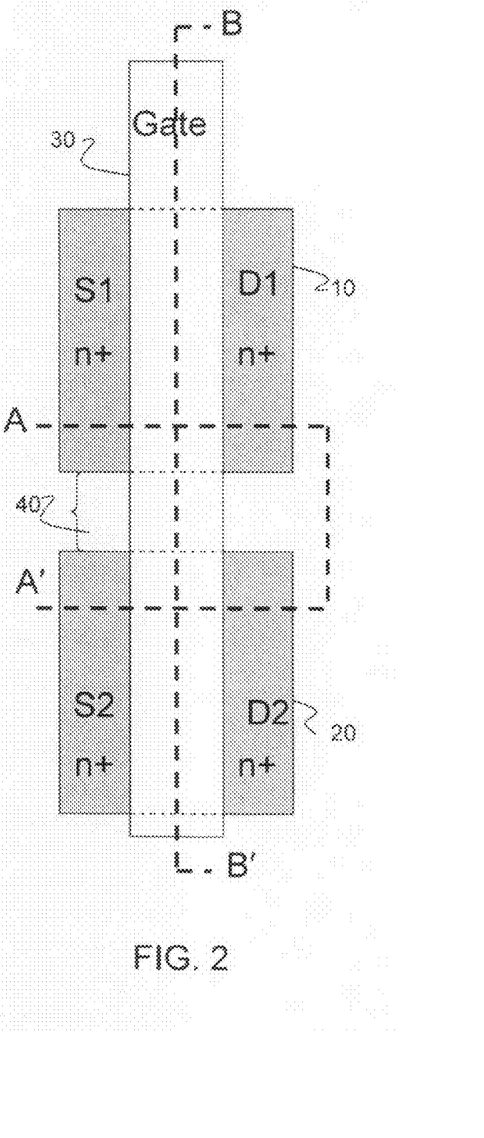
FIG. 2 shows a top view of a second device layout in accordance with a second aspect of the invention.

FIG. 2 shows a top view of a second device layout in accordance with a second aspect of the invention. In particular, FIG. 2 shows two devices (FETs) 10, 20 in an-end-to end layout (e.g., aligned along the gate width) on a same level of the structure. In this embodiment shown, the drain and source regions of the FETs 10, 20 are in alignment. Like the embodiment of FIG. 1, the FET 10 and FET 20 share a common gate 30, which may be a metal gate or poly gate.

Similar to the aspect of the invention shown in FIG. 1, in 45 nm technology, the width of the diffusion regions (n+ regions) of the FET 10 and FET 20 can range from about 100 nm to 400 nm and more specifically from about 300 nm to about 400 nm. In embodiments, the width of the diffusion regions is contemplated to be more specifically about 350 nm. In any scenario, the diffusion regions are long and narrow. The isolation region 40, between the diffusion regions of the FET 10 and FET 20, is also adjustable and can range, in embodiments, between 1× to 2× of the channel length (e.g., 45 nm to 90 nm in 45 nm technology). Those of skill in the art should realize, though, that other distances of the isolation region are also contemplated by the invention.

Similar to that of FIG. 1, in the layout of the second aspect of the invention, a high energy particle hitting either of the devices (FETs) 10, 20 in the direction of arrow "A", will not result in a SEU. Again, this is due to the fact that the devices (FETs) 10, 20 are not aligned side-by-side (along the gate length) and, as such, any high energy particle passing through one FET will not pass through or hit the other FET. Also, there is a very low probability that a high energy particle hitting the structure of FIG. 2 along a width direction will result in an SEU due to the large distances of and between the diffusion regions of the FETs and required narrow angle of attack for the high energy particle, as further discussed with the several possible scenarios shown in FIGS. 6-8.

Figure 2A:
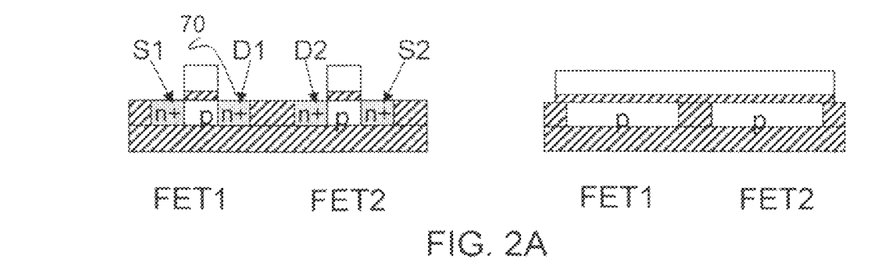
FIG. 2A shows structures and respective processing steps in accordance with the second aspect of the invention.

FIGS. 1A-1C and 2A show structures and processes for the fabrication of the structure of FIG. 2, along cross section A-A' and B-B'. As FIGS. 1A-1C are discussed above, no further explanation is necessary herein. In FIG. 2A, a conventional doping/implantation process is used to form the n+ diffusion regions 70 (source and drain regions). In the embodiment shown in FIG. 2A, diffusion (drain) D1 of FET1 is laid out end to end in alignment with the diffusion (drain) D2 of the FET2. Also, diffusion (source) S1 of the FET1 is laid out end to end in alignment with the diffusion (source) S2 of the FET2.

Third Aspect of the Invention

Figures 3A, 3B:
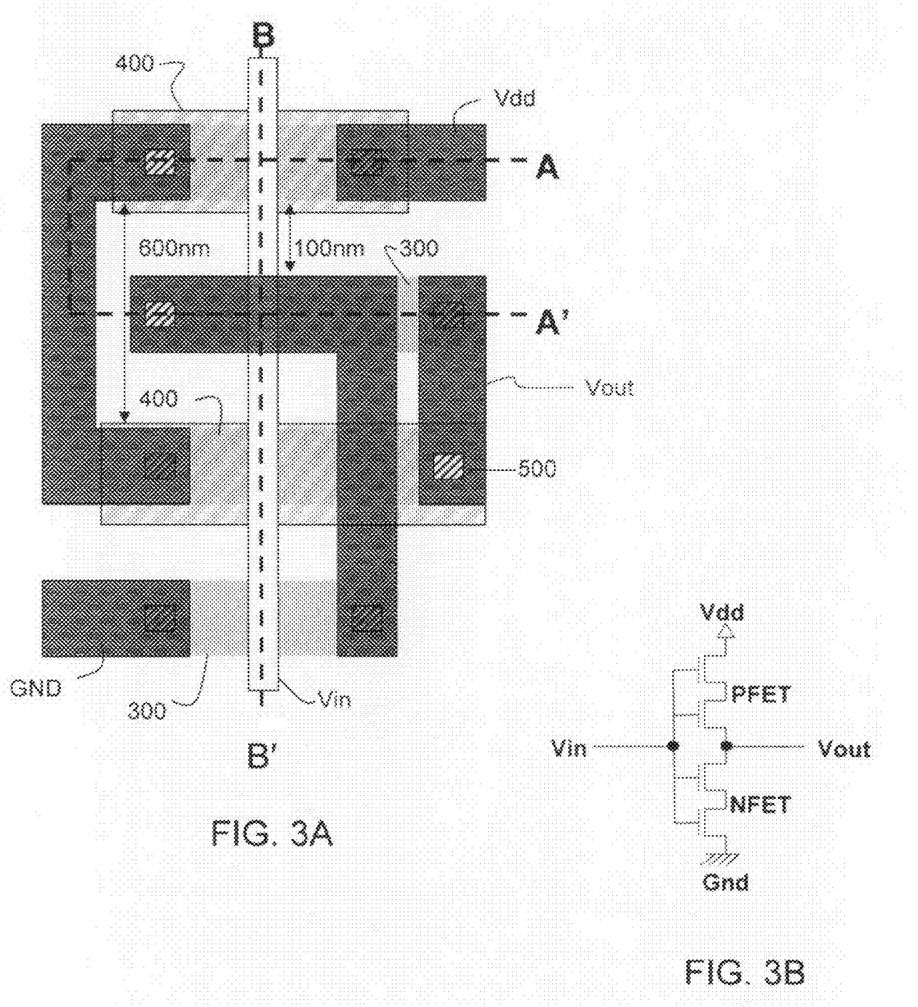
FIG. 3A shows a structure in accordance with a third aspect of the invention.
FIG. 3B shows a circuit diagram of the structure shown in FIG. 3A.

FIG. 3A shows a top view of a third device layout in accordance with a third aspect of the invention. More specifically, FIG. 3A shows a stacked, interleaved inverter design implementing the end-to-end layout of the present invention. In embodiments, the interleave design minimizes area penalty, by interleaving the series devices with others in each array.

The interleave design includes interleaved NFET devices 300 and PFET devices 400. The NFET devices 300 and PFET devices 400 have a non-shared drain, which offers better protection from SEU than conventional devices. The interleaved structure of FIG. 3A also includes metal interconnects 500 in order to electrically connect devices 300, 400 on different levels of the structure. Those of skill in the art should realize that pairs of NFETs, alone, or pairs of PFETs, alone, can also be interleaved.

As shown in FIG. 3A, the devices 300, 400 are positioned at such a distance, e.g., about 100 nm apart in 45 nm technology, such that the resulting distance between paired NFETs or PFETs are about 600 nm apart in 45 nm technology. Those of skill in the art should realize though, that other minimal distances are also contemplated between the paired NFETs or PFETs such as, for example, about 800 nm or 900 nm in 45 nm technology. As discussed above, the larger distance between the paired devices will not allow simultaneous upset of the paired devices in each series from high energy particles. As such, those of skill in the art will realize that by interleaving the devices 300, 400, there is only a small probability of charge being generated in the body of both off devices at the same time. Also, the interleaving of the NFET 300 and PFET 400 is advantageous because a charge generated in neighboring devices will turn on one of the NFETs and one of the PFETs at the same time; that is, the pair of NFETs 300 or the pair of PFETs 400 will not be turned on or off at the same time due to a high energy particle hitting the structure. This will minimize any SEUs.

FIG. 3B shows a circuit diagram of the structure shown in FIG. 3A. The circuit diagram includes the interleaved NFETs 300 and PFETs 400. The circuit diagram also shows a Ground GND, Vin, Vout and Vdd.

Figure 4A:
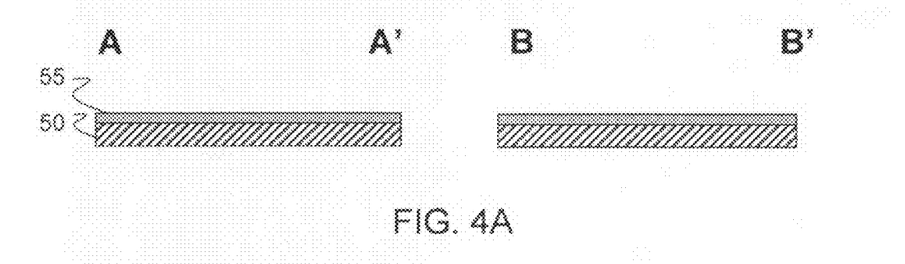
FIGS. 4A-4F show structures and respective processing steps in accordance with the third aspect of the invention.
Figure 4B:
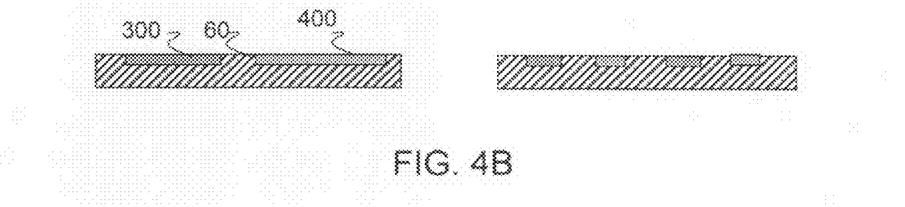

FIGS. 4A-4F show structures and processes for the fabrication of the structure of FIG. 3A, along cross section A-A' and B-B'. More specifically, FIG. 4A shows a beginning structure comprising an SOI wafer 50 (SOI substrate not shown) with a Si layer 55. In FIG. 4B, an oxide-filled shallow-trench isolation structure(s) 60 is formed using conventional processing. For example, a trench(es) is formed in the structure of FIG. 4A using a conventional etching process, e.g., reactive ion etching (RIE) and filled with an oxide material. In embodiments, the structure shown in FIG. 4B can be planarized using a conventional chemical mechanical polishing (CMP). Well implantation is performed to define the NFET 300 and PFET 400. The well implantation makes the silicon p-type doped for the NFET and n-type doped for the PFET.

Figure 4C:
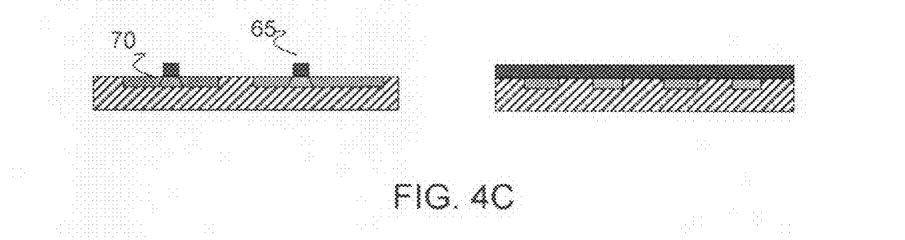

In FIG. 4C, a gate structure 65 is formed using conventional gate deposition and patterning fabrication processes. For example, in embodiments, an insulator layer (e.g., oxide) layer is deposited on the structure using a conventional oxide deposition process. Thereafter, a gate electrode layer (e.g., poly) is deposited and patterned using conventional processes. In embodiments, nitride sidewalls and cap layer may also be formed on the structure. In another processing step, source and drain doped regions 70 are formed using conventional doping/implantation processes. The source and drain regions are n+ doped for the NFET and p+ doped for the PFET.

Figure 4D:
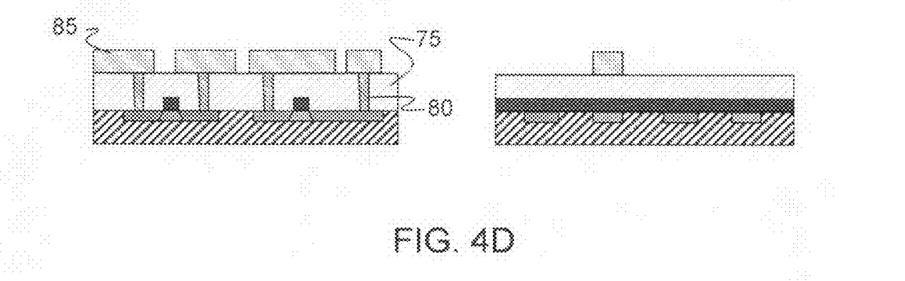

In FIG. 4D, an interlayer dielectric layer 75 is deposited on the structure of FIG. 4C. Vias 80 are formed in the interlayer dielectric layer 75, extending to the doped regions 70. Conductive material (metal) is formed in the via 80, and a metal interconnect layer 85 is deposited and patterned in conventional deposition and patterning fabrication processes.

Figure 4E:
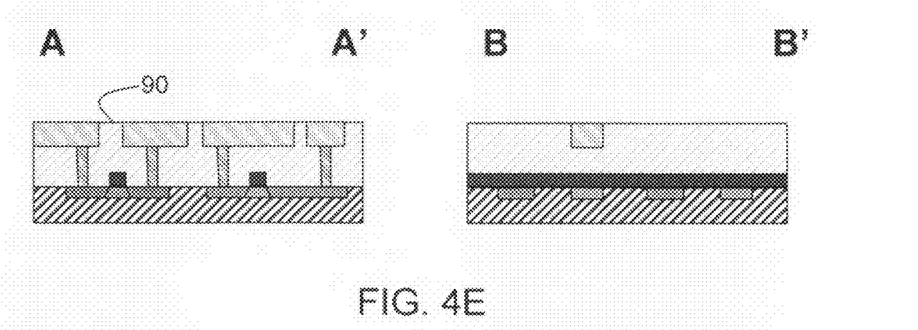
Figure 4F:
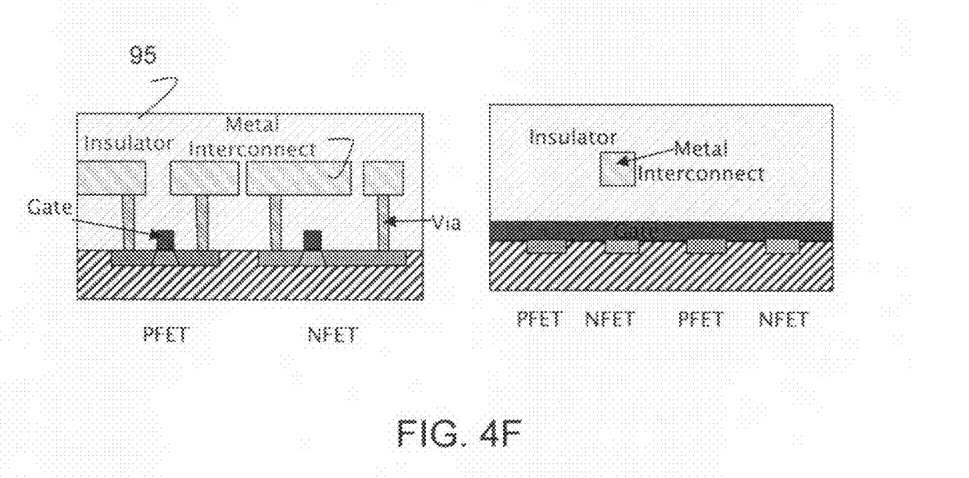

In FIG. 4E, an additional layer of dielectric is deposited on the structure of FIG. 4D to form an over layer 90. The over layer 90 and the metal interconnect layer 85 is planarized using, for example, a CMP process. In FIG. 4F, an interlayer dielectric layer 95 is deposited on the structure of FIG. 4E. The process continues with conventional back end processes.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Design Scenarios

By way of background, linear energy transfer (LET) is the energy loss per unit path length of a radiation particle in a target medium. Here, a radiation particle can be any charged particle, which includes a proton (hydrogen ion), an alpha particle (He-4 ion), or any heavier (charged) ion, that bombards the medium of the integrated circuit.

LET is proportional to $Z^{**}2/(E/amu)$. For example, LET is proportional to the square of the electric charge of the radiation particle, but inversely proportional to its kinetic energy/amu. By way of illustration, a proton has amu=1, and an alpha particle has amu=4, etc. A proton with 1 MeV and a 4 MeV alpha particle would both be associated with 1 MeV/amu, and as such, the 1 MeV proton and the 4 MeV alpha would move with the same velocity. But the LET of 4 MeV alpha particle would be four times the LET of the 1 MeV proton.

When a radiation particle goes through a (thin) target, such as a device or a circuit, the charge generated by this particle in the target can be computed as:

$dQ$=a conversion factor*LET*path length of the particle in the target.

Here, the conversion factor depends on the target material. For example, if dQ is expressed in unit of fC (femto-Coulomb), LET in units of MeV/micron and the path length in microns, then for Si, the conversion factor is 44.5. Also, because of the $Z^{**}2$ dependence of LET, heavy ions are associated with larger LET than protons or alphas. This is a major reason why in space programs heavy ion-induced SEUs are a major issue, because heavy ions are an important radiation source. On ground, SEU can be caused by terrestrial neutrons, but neutrons themselves do not carry electric charge. However, when the neutrons hit devices/circuits, they can interact with the materials via nuclear reactions to produce (secondary) protons, alphas, or some heavy recoil nuclei, all of which can cause SEUs.

Figure 5A:
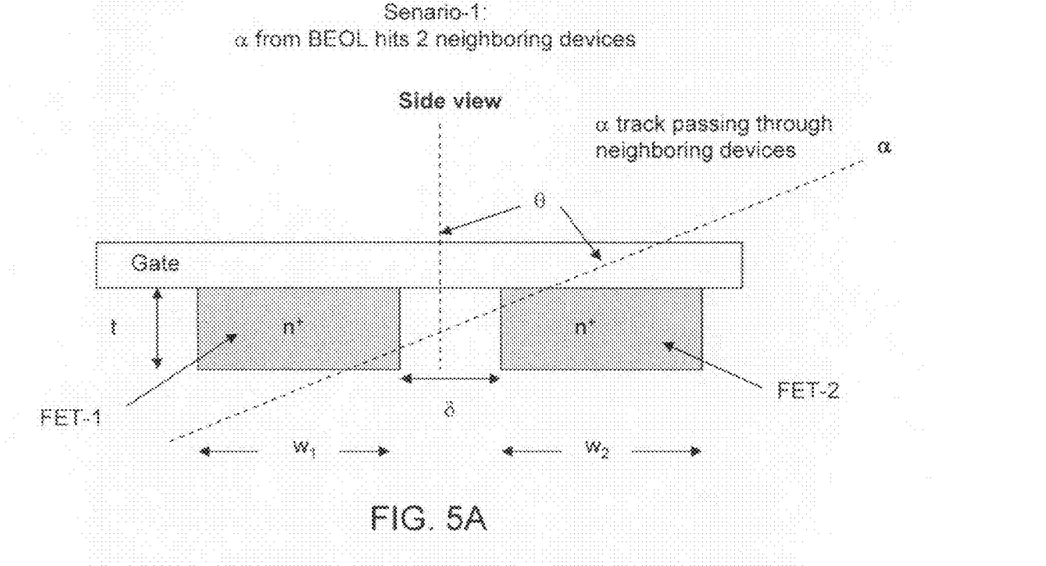
FIGS. 5A and 5B show a first case scenario using the structure of either the first or second aspect of the invention.
Figure 5B:
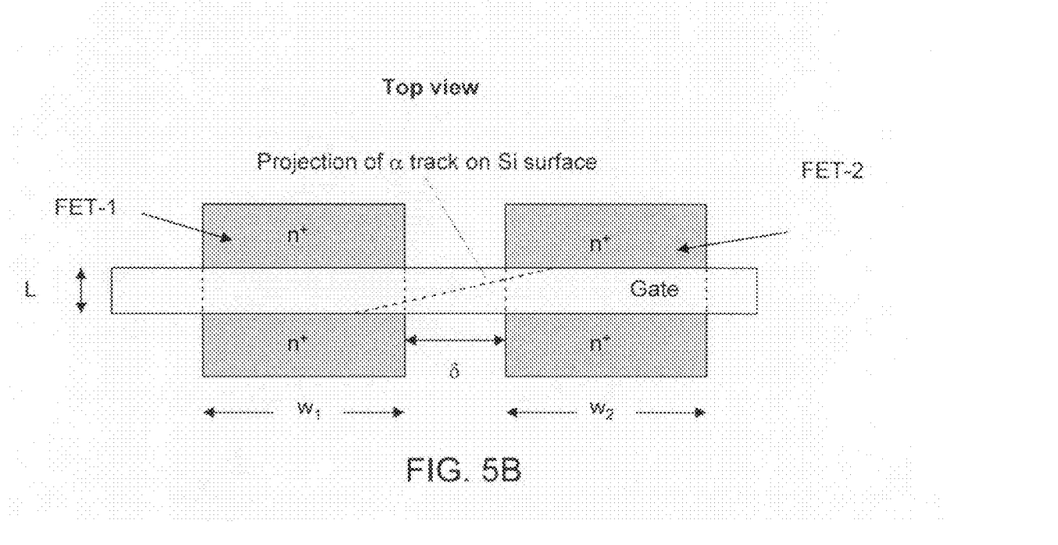
Figure 6:
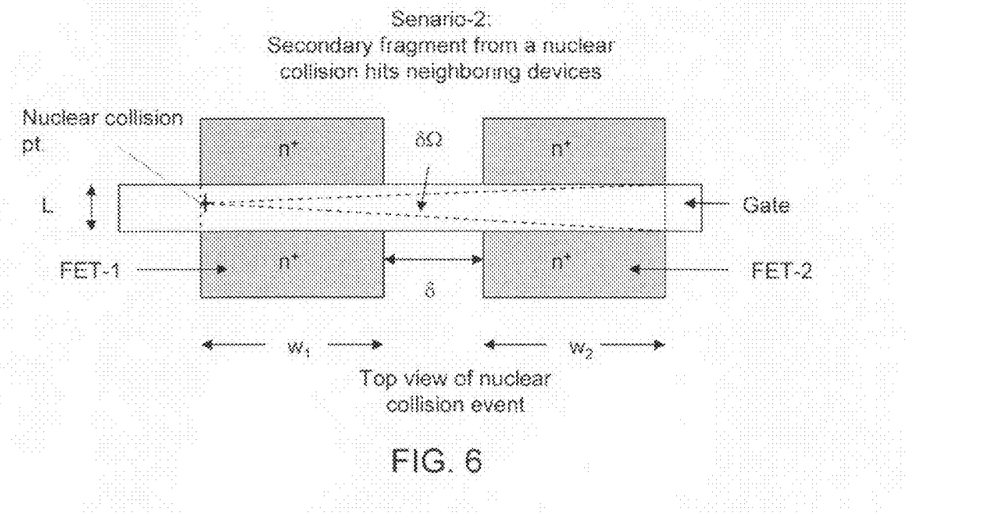
FIG. 6 shows a second case scenario using the structure of either the first or second aspect of the invention.
Figure 7:
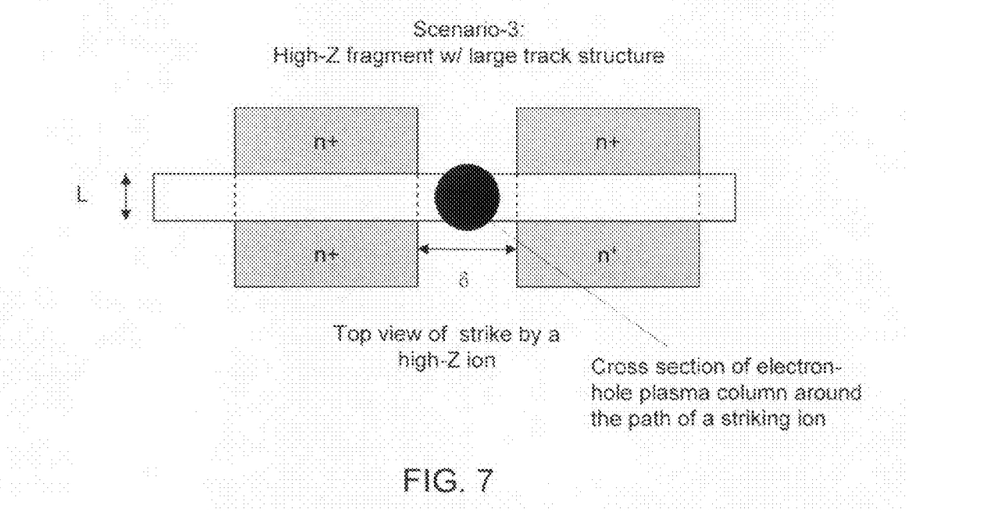
FIG. 7 shows a third case scenario using the structure of either the first or second aspect of the invention.

FIGS. 5A and 5B show a first scenario using the structure of either the first or second aspect of the invention. FIG. 6 shows a second scenario using the structure of either the first or second aspect of the invention. FIG. 7 shows a third scenario using the structure of either the first or second aspect of the invention. In each of these scenarios, a high energy particle hitting the structure can result in an SEU. However, these are rare scenarios, with a majority of high energy particle hits (trajectories) not resulting in a SEU (compared to conventional devices).

For each of FIGS. 5A-7, the following are geometric parameters:
L: channel length;
W1: width of FET-1;
W2: width of FET-2;
t: depth of channel (charge collection region);
δ: isolation separation of FET-1 and FET-2;
θ: strike angle of fragment; and
δΩ: solid angle over which a particle can hit two neighboring FETs.

The following are exemplary values used in FIGS. 5A-7; although other values are contemplated by the invention. These values should not be considered limiting features of the present invention, but are shown as an exemplary embodiment of the present invention.
L<50 nm;
W1, W2~100-400 nm;
t~50 nm; and
δ>>L, t.

FIGS. 5A and 5B show a side and top view, respectively, of a worst scenario using the first or second aspect of the invention. This scenario will result in an SEU as both devices (FETs) are shown to be hit by a high energy particle. For this worst scenario to occur, the ion must strike the device with an incident angle greater than the critical angle. That is, the α strike angle θ must exceed a critical value $θ_c$, wherein $θ > θ_c \sim \tan^{-1}(δ/t)$. For example, in the scenario of FIGS. 5A and 5B, a critical angle would be approximately 70-75 degrees. Advantageously, at other angles using the above geometric parameters for the structures of the first and second aspects of the invention, the high energy particle will not hit neighboring devices. As such, the high energy particle path (trajectory) will not result in an SEU. Comparatively, though, an SEU would result in conventional devices at these and other angles due to the side-by-side layout.

Table 1, below, shows several examples using the layout of the first or second aspect of the invention. In Table 1, the first column provides a ratio of device separation to device thickness and the second column provides the critical angle. For advanced SOI technologies, this critical angle would be approximately 70-75 degrees. The third column of Table 1 provides the ratio of particle path length in Si to BEOL thickness.

TABLE 1

| $\delta/t$ | $\theta_c$ (deg) | Path length/ BEOL thickness |
|---|---|---|
| 1 | 45 | 1.414 |
| 2 | 63.4 | 2.236 |
| 2.5 | 68.2 | 2.693 |
| 5 | 78.7 | 5.099 |
| 10 | 84.3 | 10.050 |

In one example, a typical BEOL thickness is approximately 10 μm. For $\delta/t=2.5$, α needs to travel about 26.9 μm which already exceeds the maximum range of a 5.3 MeV α emitted from a Polonium-210 source in the packaging materials. In a typical dimension of the present invention of $\delta/t>>2.5$, there is a very small probability for α from BEOL to hit two neighboring FETs.

FIG. 6 shows a second worst scenario which may result in an SEU. In this scenario, a secondary fragment from a nuclear collision can hit two neighboring devices resulting in an SEU. In this scenario, the nuclear collision point must take place near channel region of active device. The nuclear collision events that can contribute to SEUs typically take place over a vertical distance (from device to BEOL) $t_{NC}$ of approximately 20-30 μm. Advantageously, using the geometric parameters for the structures of the first and second aspects of the invention, it is a rare even that the high energy particle will hit neighboring devices.

Also, the solid angle shown in FIG. 6 over which a particle can hit two neighboring FETs, $\delta\Omega$, is:

$$\delta\Omega=(\pi/4)[L/(W_1+W_2+\delta)]^2+O(x^4), \text{ where } x=L/(W_1+W_2+\delta).$$

For advanced SOI technologies, this solid angle would be less than 0.01 radians, using typical values of $L/(W_1+W_2+\delta)<0.1$ In FIG. 6 the fraction of worst case events among nuclear collision events is:

$$\sim(t/t_{NC})(\delta\Omega/4\pi)\sim(t/16t_{NC})[L/(W_1+W_2+\delta)]^2\sim1.6\times10^{-6},$$

where the estimates are based on typical values of parameters: t=50 nm; $t_{NC}$=20 μm and $L/(W_1+W_2+\delta)$=0.1

FIG. 7 shows a third scenario which may result in an SEU. In this scenario, a high Z fragment (e.g., calcium, iron, etc.) has a large track structure. The scenario of FIG. 7 is relevant mainly for space programs for which high-Z/high-energy ions in galactic cosmic rays are the dominant particle sources. (For applications on ground, high-Z particles are usually absent, except when heavy metals such as tungsten are present in the BEOL materials.) Dominant components of galactic cosmic rays include, for example, protons, He, C, O, and HI, with ion flux decreasing with increasing Z.

Designing sufficiently large isolation separation of neighboring FETs (δ) is very effective in reducing sensitivity to the scenario in FIG. 7. As an example, arranging for δ>radius of electron-hole plasma column would reduce the probability of this scenario to a minimum. The radius of electron-hole plasma column along ion track can be, for example, H~10 nm and He~30 nm. Also, as should be understood by those of skill in the art, the radius increases gradually for heavier ions, e.g., from He to ions like C, e.g., O~50-100 nm. As shown for the layouts of the first and second aspect of the invention, the electron-hole plasma column of high-Z HI hit the middle of the isolation region, and, at the most, overlap on the narrow sides of the FETs, which significantly reduces the deposited charge in both FETs because W/L>>1.

The designs discussed in the background section, though, are not immune to HI track structure problem, and that the layouts of the present invention are superior to such known devices. Also, in the designs discussed in the background, high-Z HI hitting the middle n+ region can easily deposit charge in both FETs, because the length of middle n+ region<diffusion length, something that will not occur in the invention. Additionally, in the designs discussed in the background, high-Z HI hitting middle isolation region can deposit charge in both FETs, because the e-h plasma column can overlap on the wide sides of n+ regions of both FETs, something that will not occur in the invention.

Design Structure

Figure 8:
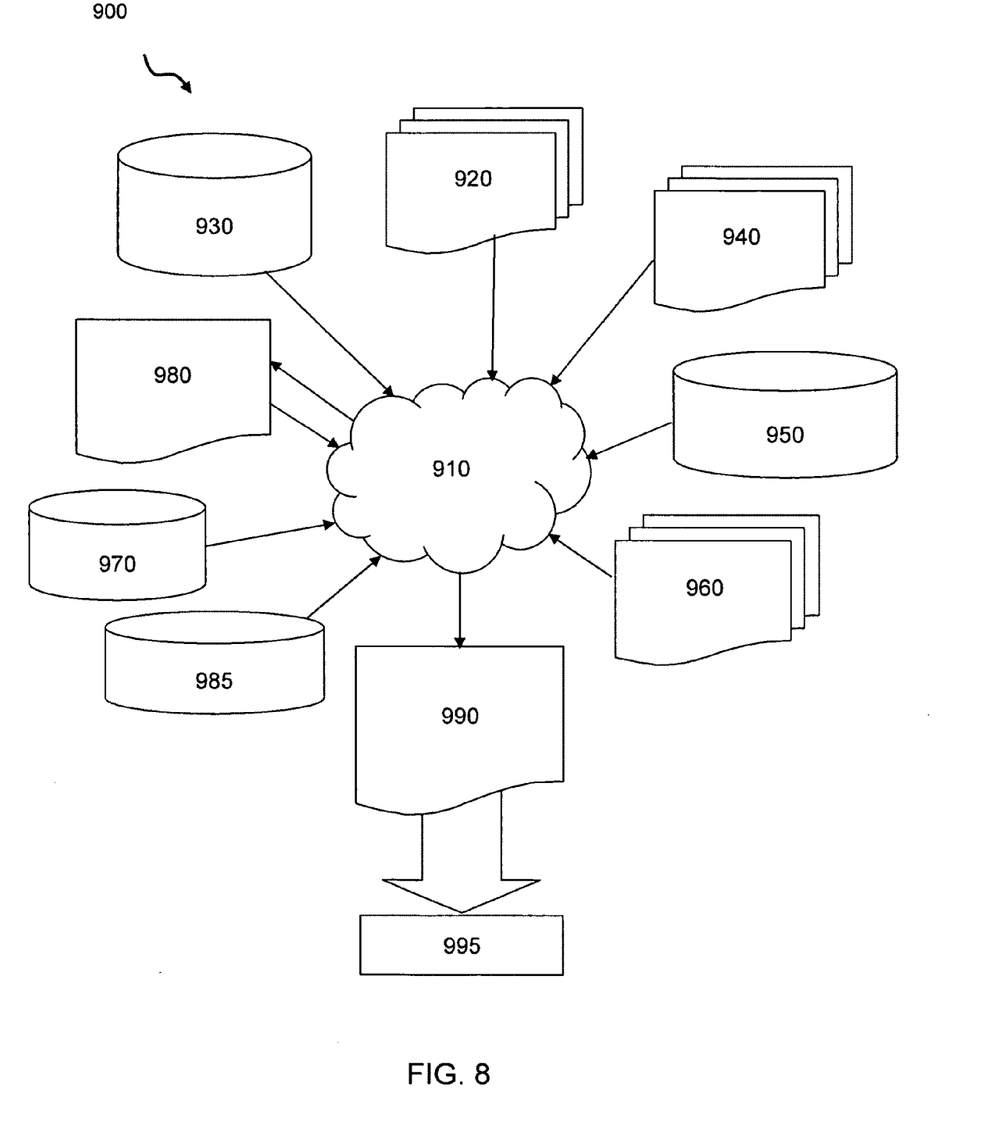
FIG. 8 is a flow diagram of a design process used in semiconductor design, manufacture, and/or test.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, 3A and 3B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2, 3A and 3B to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 3A and 3B. In one embodiment, design structure 990 may comprise a compiled, executable HDL simulation model that functionally simulates the devices shown in FIGS. 1, 2, 3A and 3B.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 3A and 3B. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A structure, comprising:
    a gate having a length extending in a first direction and a width extending in a second direction;
    a first device having a first diffusion comprising a drain region and a source region, wherein the first diffusion has a length extending in the first direction and a width extending in the second direction;
    a second device having a second diffusion comprising a drain region and a source region, wherein the second diffusion has a length extending in the first direction and a width extending in the second direction; and
    a first isolation region separating the first diffusion of the first device and the second diffusion of the second device,
    wherein:
        the first device and the second device are aligned in the second direction in an end-to-end layout along the width of the gate;
        the width of the first diffusion of the first device is a first multiple of the length of the gate or of a channel length of the structure;
        the width of the second diffusion of the second device is the first multiple of the length of the gate or of the channel length of the structure; and
        the width of the first diffusion of the first device and the width of the second diffusion of the second device range from about 2× to about 10× of the length of the gate or of the channel length.

2. The structure of claim 1, wherein:
    the gate comprises a common gate for both the first device and the second device; and the common gate is a metal gate or poly gate and extends in the first direction.

3. The structure of claim 1, wherein:
the drain region of the first device is aligned with the source region of the second device along the first direction; and
the source region of the first device is aligned with the drain region of the second device along the first direction.

4. The structure of claim 1, wherein:
the drain region of the first device is aligned with the drain region of the second device along the first direction; and
the source region of the first device is aligned with the source region of the second device along the first direction.

5. The structure of claim 1, wherein the first isolation region is about 1× to about 2× of the length of the gate or of the channel length.

6. The structure of claim 1, wherein the width of the first diffusion of the first device and the width of the second diffusion of the second device range from about 6× to about 10× of the length of the gate or of the channel length.

7. The structure of claim 1, wherein the first device and the second device have a layout such that a high energy particle passing through either the first device or the second device in a horizontal or vertical direction with respect to the length of the gate or the channel length will not hit the other device.

8. The structure of claim 1, further comprising:
a third device having a third diffusion comprising a drain region and source region, wherein the third diffusion has a length extending in the first direction and a width extending in the second direction; and
a fourth device having a fourth diffusion comprising a drain region and source region, wherein the fourth diffusion has a length extending in the first direction and a width extending in the second direction, wherein:
the first and second devices are a first type device and the third and fourth devices are a second type device, different than the first type device,
the third and fourth devices are aligned in an end-to-end layout along the width of the gate;
the diffusion of the third device and the diffusion of the fourth device are separated by a second isolation region, and
the first, second, third and fourth devices have a layout that is an interleaved pattern.

9. The structure of claim 8, wherein the interleaved pattern comprising the first device, the third device, the second device and the fourth device, in order.

10. A structure, comprising:
a gate having a length extending in a first direction and a width extending in a second direction;
a first device having a diffusion comprising a drain region and a source region, wherein the diffusion has a length extending in the first direction and a width extending in the second direction; and
a second device having a diffusion comprising a drain region and a source region, wherein the second diffusion has a length extending in the first direction and a width extending in the second direction,
wherein:
the first and second device are aligned in an end-to-end layout along the width of the diffusion of the first device and the width of the diffusion of the second device;
a first isolation region separates the diffusion of the first device and the diffusion of the second device; and
the drain region of the first device is electrically connected to the source region of the second device a length of the first isolation region is about twice a channel length of the first device and second device;
the width of the diffusion of the first device and the width of the diffusion of the second device range from about 6× to about 10× of the channel length; and
the first device and the second device have a layout such that a high energy particle passing through either the first device or the second device in a horizontal or vertical direction with respect to the channel length will not hit the other device.

11. The structure of claim 10, wherein:
a body of the structure is bounded in the first direction by the first diffusion region and the second diffusion region;
the body of the structure is bounded in the second direction by isolation regions,
the body of the structure is bounded vertically on a top by a gate insulator underneath a gate electrode;
the body of the structure is bounded at a bottom by a buried oxide;
the gate comprises a common gate for both the first device and the second device; and
the common gate is a metal gate or poly gate and extends in the first direction.

12. A structure comprising:
a gate having a length extending in a first direction and a width extending in a second direction;
a first device having a first diffusion comprising a drain region and a source region, wherein the first diffusion has a length extending in the first direction and a width extending in the second direction;
a second device having a second diffusion comprising a drain region and a source region, wherein the second diffusion has a length extending in the first direction and a width extending in the second direction; and
a first isolation region separating the first diffusion of the first device and the second diffusion of the second device,
wherein:
the first device and the second device are aligned in the second direction in an end-to-end layout along the width of the gate;
the width of the first diffusion of the first device is a first multiple of the length of the gate or of a channel length of the structure;
the width of the second diffusion of the second device is the first multiple of the length of the gate or of the channel length of the structure;
the first device and the second device are a same type device;
the first isolation region is about 1× to about 2× of the length of the gate or the channel length;
the width of the diffusion of the first device and the width of the diffusion of the second device range from about 6× to about 10× of the gate length or channel length;
the drain region of the first device is electrically connected to the source region of the second device; and
the first device and the second device have a layout such that a high energy particle passing through either the first device or the second device in a horizontal or vertical direction with respect to the length of the gate or the channel length will not hit the other device.

13. A structure, comprising:
a first device having a first diffusion area;
a second device having a second diffusion area;
a first isolation region isolating the first device from the second device; and a common gate associated with the first device and the second device, wherein:
the common gate provides a channel in the diffusion area of the first device and in the diffusion area of the second device;
a length of the common gate extends in a first direction that is along a length of the channel;
a width of the common gate extends in a second direction that is perpendicular to the length of the channel;
a width of the first diffusion area of the first device extends in the second direction;
a width of the diffusion area of the second device extends in the second direction;
the width of the first diffusion area is aligned with the width of the second diffusion area in an end-to-end layout along the second direction;
the first isolation region extends in the first direction between the first diffusion area and the second diffusion area;
the width of the first diffusion area is a first multiple of a gate length or channel length of the common gate;
the width of the second diffusion area is the first multiple of the gate length or channel length of the common gate; and
the width of the first diffusion area and the width of the second diffusion area range from about 2× to about 10× of the gate length or the channel length.

14. The structure of claim 13, further comprising:
a third device having a third diffusion area;
a fourth device having a fourth diffusion area; and
a second isolation region isolating the third diffusion area
wherein:
the third and fourth devices are a second type device, different than the first and second devices,
the third diffusion area and the fourth diffusion area have respective lengths extending in the first direction and respective widths extending in the second direction,
the widths of the third and fourth devices are aligned in an end-to-end layout along the second direction,
the third and fourth devices are separated along the second direction by the second isolation region, and
the first, second, third and fourth devices have a layout in an interleaved pattern.

15. The structure of claim 13, wherein:
the first diffusion area and the second diffusion area each include a drain region and a source region;
the drain region of the first diffusion region is aligned with the source region of the second diffusion region along the second direction; and
the source region of the first diffusion region is aligned with the drain region of the second diffusion region along the second direction.

16. The structure of claim 13, wherein:
the first diffusion area and the second diffusion area each include a drain region and a source region;
the drain region of the first diffusion region is aligned with the drain region of the second diffusion region along the second direction; and
the source region of the first diffusion region is aligned with the source region of the second diffusion region along the second direction.

17. The structure of claim 13, wherein:
the first isolation region is about 1× to about 2× of the gate length or the channel length;
the width of the first diffusion area and the width of the second diffusion area range from about 6× to about 10× of the gate length or the channel length;
a drain region of the first device is electrically connected to a source region of the second device; and
the first device and the second device have a layout such that a high energy particle hitting either the first device or the second device in a direction of the gate length or the channel length will not result in a single event upset (SEU).

18. The structure of claim 13, wherein the first device and the second device have a layout such that a high energy particle passing through either the first device or the second device in a horizontal or vertical direction with respect to the gate length or the channel length will not hit the other device.

19. A method of forming a structure, comprising:
forming a first device with a first diffusion comprising a drain region and source region, wherein:
a length of the first diffusion extends in a first direction;
a width of the first diffusion extends in a second direction that is perpendicular to the first direction that is along a length of a gate; and
the width of the first diffusion is a first multiple of the gate length or a channel length of the structure;
forming a second device with a second diffusion comprising a drain region and source region, wherein:
a length of the second diffusion extends in the first direction;
a width of the second diffusion extends in the second direction;
the second diffusion is aligned with the first diffusion in an end-to-end layout along the second direction; and
the width of the second diffusion is the first multiple of the gate length or the channel length of the structure; and
forming an isolation region separating the first diffusion and the second diffusion, wherein a width of the isolation region is a second multiple of the gate length or the channel length of the structure;
wherein the width of the first diffusion and the width of the second diffusion range from about 2× to about 10× of the gate length or the channel length.

20. The method of claim 19, further comprising:
forming a third device with a third diffusion comprising a drain region and source region;
forming a fourth device with a fourth diffusion comprising a drain region and source region;
forming an a second isolation region separating the third diffusion and the fourth diffusion,
wherein:
the third diffusion area and the fourth diffusion area have respective lengths extending in the first direction and respective widths extending in the second direction,
the widths of the third and fourth devices are aligned in an end-to-end layout along the second direction,
the first device, the third device, the second device and the fourth device are arranged in an interleaved pattern in such order, and
the first device and the second device are a first type device and the third and fourth devices are a second type device, different from the first type device.

21. A design structure embodied in a machine readable medium for designing, manufacturing, or testing an integrated circuit, the design structure comprising:
a first device having a first diffusion comprising a drain region and source region, wherein the first diffusion has a length extending in the first direction and a width extending in the second direction;

a second device having a second diffusion comprising a drain region and source region, wherein the second diffusion has a length extending in the first direction and a width extending in the second direction; and a first isolation region separating the first diffusion and the second diffusion, wherein:

the first direction extends along a gate length or channel length of the structure, the first device and the second device are aligned in an end-to-end layout along the second direction;

the width of the first diffusion is a first multiple of the gate length or channel length of the design structure;

the width of the second diffusion is the first multiple of the gate length or channel length of the design structure; and the width of the first diffusion and the width of the second diffusion range from about 2× to about 10× of the gate length or the channel length.

22. The design structure of claim 21, wherein the design structure comprises a netlist.

23. The design structure of claim 21, wherein the design structure resides on storage medium as a data format used for the exchange of layout data of integrated circuits.

24. The design structure of claim 21, wherein the design structure resides in a programmable gate array.

* * * * *